United States Patent
Tsai et al.

(10) Patent No.: US 8,896,478 B2
(45) Date of Patent: Nov. 25, 2014

(54) SUCCESSIVE APPROXIMATION ANALOG-TO-DIGITAL CONVERTER USING CAPACITOR ARRAY WITH SUB-CAPACITORS CONFIGURED BY CAPACITOR DISASSEMBLING AND RELATED METHOD THEREOF

(71) Applicant: Realtek Semiconductor Corp., HsinChu (TW)

(72) Inventors: Jen-Huan Tsai, Hsinchu (TW); Po-Chiun Huang, Hsinchu (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 13/959,722

(22) Filed: Aug. 5, 2013

(65) Prior Publication Data
US 2014/0035772 A1 Feb. 6, 2014

(30) Foreign Application Priority Data

Aug. 6, 2012 (TW) .............................. 101128229 A (51) Int. Cl.
*H03M 1/12* (2006.01)
*H03M 1/06* (2006.01)
*H03M 1/46* (2006.01)

(52) U.S. Cl.
CPC .............. *H03M 1/12* (2013.01); *H03M 1/069* (2013.01); *H03M 1/466* (2013.01)
USPC .......... 341/172; 341/144; 341/160; 341/156; 341/166

(58) Field of Classification Search
CPC ........ H03M 1/12; H03M 1/069; H03M 1/466
USPC .................................................. 341/122–172
See application file for complete search history.

(56) References Cited

U.S. PATENT DOCUMENTS

| | | | | |
|---|---|---|---|---|
| 6,400,302 | B1* | 6/2002 | Amazeen et al. | 341/172 |
| 6,747,589 | B2* | 6/2004 | Srinivasan et al. | 341/172 |
| 7,675,452 | B2* | 3/2010 | Madhavan et al. | 341/162 |
| 7,893,860 | B2* | 2/2011 | Cho et al. | 341/161 |
| 8,004,447 | B2* | 8/2011 | Hsu | 341/161 |
| 8,310,388 | B2* | 11/2012 | Chang et al. | 341/156 |
| 8,344,930 | B2* | 1/2013 | Lin | 341/172 |
| 8,416,116 | B2* | 4/2013 | Chang et al. | 341/172 |
| 8,477,058 | B2* | 7/2013 | Chang et al. | 341/163 |
| 8,638,248 | B2* | 1/2014 | Wu et al. | 341/118 |
| 2014/0035771 | A1* | 2/2014 | Tsai et al. | 341/172 |

* cited by examiner

*Primary Examiner* — Lam T Mai
(74) *Attorney, Agent, or Firm* — Winston Hsu; Scott Margo (57) ABSTRACT

A successive approximation analog-to-digital converter (SAR ADC) includes a capacitor array and a comparator. The capacitor array has M capacitors which are arranged to perform capacitor switching operations sequentially, wherein a sum of capacitance values of the M capacitors is equal to ($2^N$−1) unit capacitors, M>N, and M and N are both positive integers. The comparator is arranged for comparing an output of the capacitor array and an analog input sequentially.

8 Claims, 8 Drawing Sheets

$$
\begin{array}{r}
0\ 1\ 1\ 1\ 1\ 0\ 0\ 0\ 0 * B1 \\
B2 \\
B3 \\
B4 \\
B5 \\
0\ 0\ 0\ 0\ 0\ 1\ 1\ 1\ 1\ 0 * B6 \\
B7 \\
B8 \\
B9 \\
B10 \\
B11 \\
+ \hspace{4em} B12 \\
\hline
d_1\ d_2\ d_3\ d_4\ d_5\ d_6\ d_7\ d_8\ d_9\ d_{10}
\end{array}
$$

| Cycle | 1 | 2 | 3 | 4 | 5 | 6 | 7 | 8 | 9 | 10 | 11 | 12 | 13 |
|---|---|---|---|---|---|---|---|---|---|---|---|---|---|
| Capacitance (C) | | 192 | 128 | 64 | 56 | 32 | 16 | 8 | 7 | 4 | 2 | 1 | 1 |
| Error tolerance of switched capacitor (C) | 128 | 64 | 64 | 16 | 8 | 8 | 8 | 2 | 1 | 1 | 1 | 0 | 0 |
| Settling error tolerance (%) | | 33.3 | 50 | 25 | 14.3 | 25 | 50 | 25 | 14.3 | 25 | 50 | 0 | 0 |

FIG. 6

$$
\begin{array}{r}
0\ 1\ 1\ 0\ 0\ 0\ 0\ 0\ 0\ 1 * B1 \\
0\ 1\ 0\ 0\ 0\ 0\ 0\ 0\ 0\ 1 * B2 \\
0\ 0\ 1\ 0\ 0\ 0\ 0\ 0\ 0\ 1 * B3 \\
0\ 0\ 0\ 1\ 1\ 1\ 0\ 0\ 0\ 0 * B4 \\
0\ 0\ 0\ 1\ 0\ 0\ 0\ 0\ 0\ 0 * B5 \\
0\ 0\ 0\ 0\ 1\ 0\ 0\ 0\ 0\ 0 * B6 \\
0\ 0\ 0\ 0\ 0\ 1\ 0\ 0\ 0\ 0 * B7 \\
0\ 0\ 0\ 0\ 0\ 0\ 1\ 1\ 1\ 0 * B8 \\
0\ 0\ 0\ 0\ 0\ 0\ 1\ 0\ 0\ 0 * B9 \\
0\ 0\ 0\ 0\ 0\ 0\ 1\ 1\ 0\ 0 * B10 \\
0\ 0\ 0\ 0\ 0\ 0\ 0\ 0\ 1\ 0 * B11 \\
0\ 0\ 0\ 0\ 0\ 0\ 0\ 0\ 1\ 0 * B12 \\
+\ \ 0\ 0\ 0\ 0\ 0\ 0\ 0\ 0\ 0\ 1 * B13 \\
\hline
D_1\ D_2\ D_3\ D_4\ D_5\ D_6\ D_7\ D_8\ D_9\ D_{10}
\end{array}
$$

SUCCESSIVE APPROXIMATION ANALOG-TO-DIGITAL CONVERTER USING CAPACITOR ARRAY WITH SUB-CAPACITORS CONFIGURED BY CAPACITOR DISASSEMBLING AND RELATED METHOD THEREOF

BACKGROUND OF THE INVENTION

1. Field of the Invention

The disclosed embodiments of the present invention relate to a successive approximation analog-to-digital converter (SAR ADC).

2. Description of the Prior Art

The SAR ADCs can be classified into two categories: the binary-search SAR ADC and the non-binary-search SAR ADC. Most prior art SAR ADCs belong to the binary-search category. Signals must be ensured to be stable at a reference voltage (½LSB, i.e. ½^N+1 reference voltage, wherein N is a resolution of the SAR ADC) during the binary search. Besides, the non-traditional binary-search method can be further classified into two categories: the sub-radix 2 binary-search method and the redundant radix-2 binary-search method. With regard to the two categories of the non-traditional binary-search method, different settling error tolerance capabilities are achieved based on the magnitude of sub-radix 2 or the added redundancy amount.

SUMMARY OF THE INVENTION

One of the objectives of the present invention is to provide a novel successive approximation analog-to-digital converter (SAR ADC) which is capable of tolerating comparison errors induced from comparators to therefore achieve the purpose of increasing the settling error tolerance. The number of used capacitors can be reduced. Besides, the complexity of calibration logics can be reduced by using simple adders and multiplexers.

According to a first aspect of the present invention, a successive approximation analog-to-digital converter (SAR ADC) is disclosed. The SAR ADC includes a capacitor array and a comparator. The capacitor array has M capacitors arranged to perform capacitor switching operations sequentially, wherein a sum of capacitance values of the M capacitors is equal to $(2^N-1)$ unit capacitors, M>N, and M and N are both positive integers. The comparator compares an output of the capacitor array and an analog input sequentially.

According to a second aspect of the present invention, a successive approximation analog-to-digital conversion method is disclosed. The method includes: controlling a capacitor array to make M capacitors perform capacitor switching operations sequentially, wherein a sum of capacitance values of the M capacitors is equal to $(2^N-1)$ unit capacitors, M>N, and M and N are both positive integers; and comparing an output of the capacitor array with an analog input sequentially.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
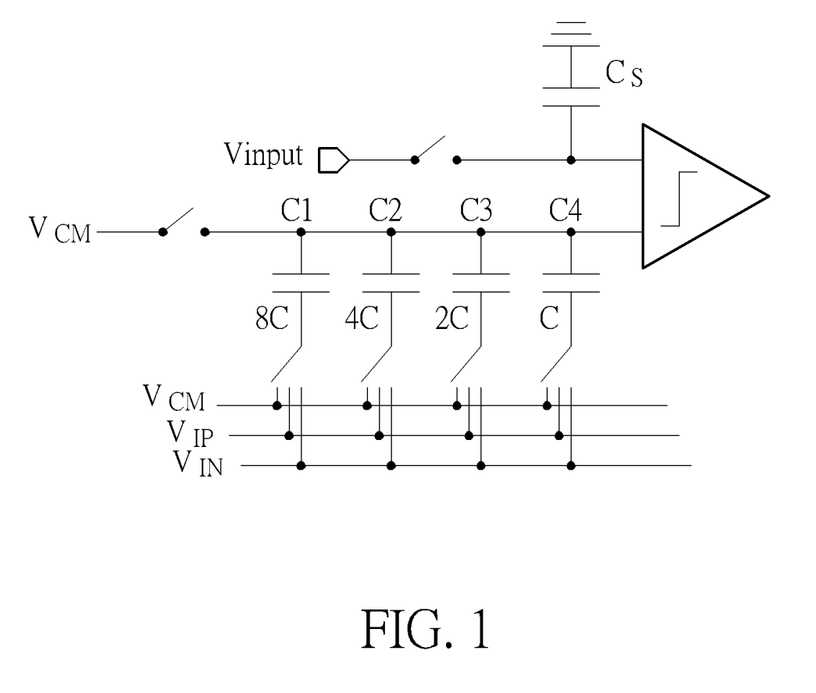
FIG. 1 is a diagram illustrating a SAR ADC according to a first embodiment of the present invention.

FIG. 1 is a diagram illustrating a SAR ADC according to a first embodiment of the present invention. The SAR ADC is a 5-bit SAR ADC with a single-ended input (N=5). A comparator is placed on the right side, vcm is an input common mode level, and Vip and Vin are positive and negative reference voltages, respectively.

In this embodiment, any number of capacitors of the conventional binary capacitor array {C1, C2, C3, C4}=[8, 4, 2, 1] can be selected to undergo a binary disassembling process.

Suppose that only the first capacitor C1=8 is disassembled into any numbers, where a sum of the numbers is a power of two ($2^N$) value. When the first capacitor C1=8 is disassembled into two sub-capacitors, there will be four possible cases:
1. disassembling 8 into 7+1, such that the rearranged capacitors will be [7, 4, 2, 1, 1];
2. disassembling 8 into 6+2, such that the rearranged capacitors will be [6, 4, 2, 2, 1];
3. disassembling 8 into 5+3, such that the rearranged capacitors will be [5, 4, 3, 2, 1]; and
4. disassembling 8 into 4+4, such that the rearranged capacitors will be [4, 4, 4, 2, 1].

The capacitors are arranged to perform the capacitor switching operations in a descending capacitance order as illustrated above. Therefore, there is a need for an extra comparison cycle. As a result, five capacitor switching operations are performed. According to the negative feedback operation performed by the SAR ADC, the comparator performs the comparison six times to thereby obtain a six-bit code=[B1, B2, B3, B4, B5, B6]. The digital error calibration manner could be represented in decimal or binary.

(1) If it is represented in decimal, each bit has a weighting factor which is twice as large as the size of the capacitor (i.e., the number of unit capacitors) except the last bit whose weighting factor is 1:
1. Dcode=14*B1+8*B2+4*B3+2*B4+2*B5+B6;

2. Dcode=12*B1+8*B2+4*B3+4*B4+2*B5+B6;
3. Dcode=10*B1+8*B2+6*B3+4*B4+2*B5+B6;
4. Dcode=8*B1+8*B2+8*B3+4*B4+2*B5+B6.

(2) If it is represented in binary:
1. Dcode=01110*B1+01000*B2+00100*B3+00010*B4+ 00010*B5+B6;
2.-4. Dcode is deduced by the same manner.

As can be learned from the above description, the calibration logic can be completed by using simple adders and multiplexers.

When the first capacitor C1=8 is disassembled into three sub-capacitors, there will be five possible cases:
1. disassembling 8 into 6+1+1, such that the rearranged capacitors will be [6, 4, 2, 1, 1, 1];
2. disassembling 8 into 5+2+1, such that the rearranged capacitors will be [5, 4, 2, 2, 1, 1];
3. disassembling 8 into 4+2+2, such that the rearranged capacitors will be [4, 4, 2, 2, 2, 1];
4. disassembling 8 into 4+3+1, such that the rearranged capacitors will be [4, 4, 3, 2, 1, 1]; and
5. disassembling 8 into 3+3+1, such that the rearranged capacitors will be [4, 3, 3, 2, 2, 1].

All of the capacitors are switched in a descending capacitance order as illustrated above. Therefore, there is a need for two extra comparison cycles. As a result, six capacitor switching operations are performed. The calibration manner is similar to that mentioned above.

Figure 2:
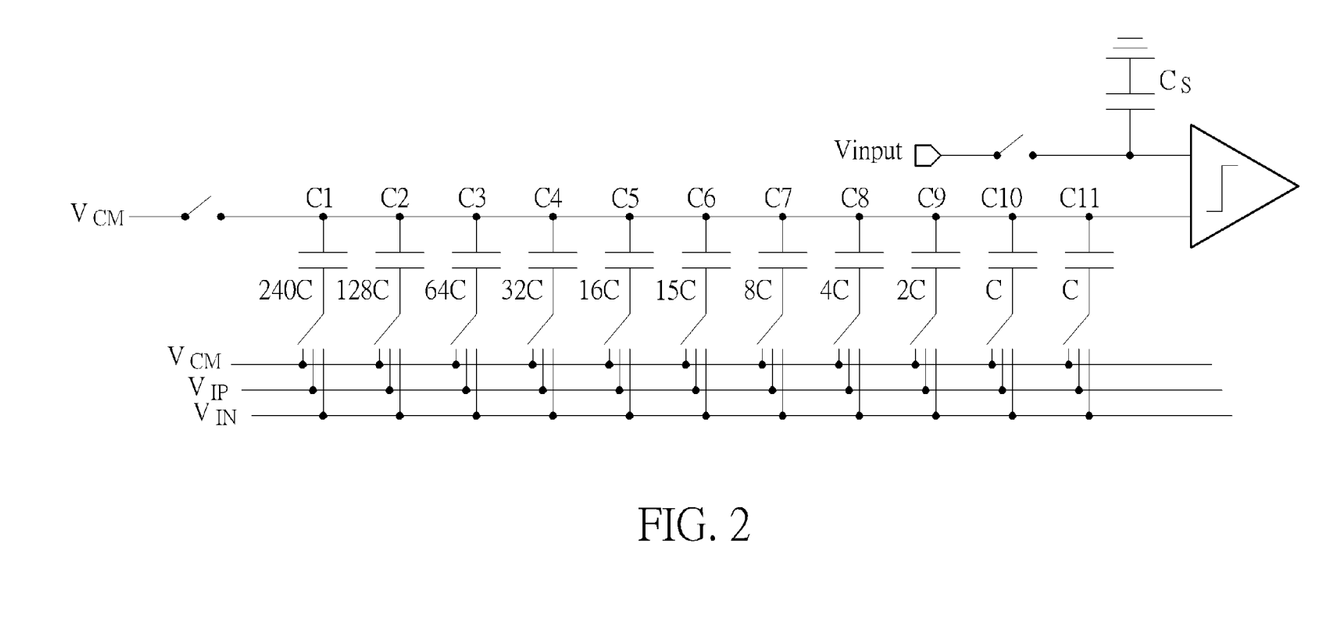
FIG. 2 is a diagram illustrating a SAR ADC according to a second embodiment of the present invention.

FIG. 2 is a diagram illustrating a SAR ADC according to a second embodiment of the present invention. The SAR ADC is a 10-bit SAR ADC with a single-ended input (N=10). The decision errors of the comparators are tolerated through utilizing a more conservative binary-search method.

In this embodiment, the arrangement of the proposed binary capacitor array is described as follows.

The original capacitors are {C1, C2, C3, C4, C5, C6, C7, C8, C9}=[256C, 128C, 64C, 32C, 16C, 8C, 4C, 2C, 1C]. According to the desired error tolerance capability of each bit, the capacitors C1 and C5 are designed by:
1. disassembling C1 into 240C+16C; and
2. disassembling C5 into 15C+1C.

After capacitor rearrangement based on the descending capacitance order is done, the capacitor array of the disclosed SAR ADC will be [C1, C2, C3, C4, C5, C6, C7, C8, C9, C10, C11]=[240C, 128C, 64C, 32C, 16C, 15C, 8C, 4C, 2C, 1C, 1C]. After sequential comparison is performed, a 12-bit output code [B1, B2, B3, B4, B5, B6, B7, B8, B9, B10, B11, B12] will be obtained. The calibration logical method is as follows.

Lastly, 10-bit output code d1-d10 is obtained:

$$\begin{array}{r} 0111100000 * B1 \\ 0100000000 * B2 \\ 0010000000 * B3 \\ 0001000000 * B4 \\ 0000100000 * B5 \\ 0000011110 * B6 \\ 0000010000 * B7 \\ 0000001000 * B8 \\ 0000000100 * B9 \\ 0000000010 * B10 \\ 0000000010 * B11 \\ + 0000000001 * B12 \\ \hline d_1 d_2 d_3 d_4 d_5 d_6 d_7 d_8 d_9 d_{10} \end{array}$$

The equivalent logical simplification can be performed upon the calibration logic based on the digital characteristics. For example, the multiplication operation of 000010000*Bi can be omitted by placing Bi at the corresponding bit for an addition operation. Since Bi is either 0 or 1, the multiplication operation can be simply implemented by an 'AND' operation or a multiplexer/selector. That is, the actual circuit is not limited to a single implementation.

Figure 3:
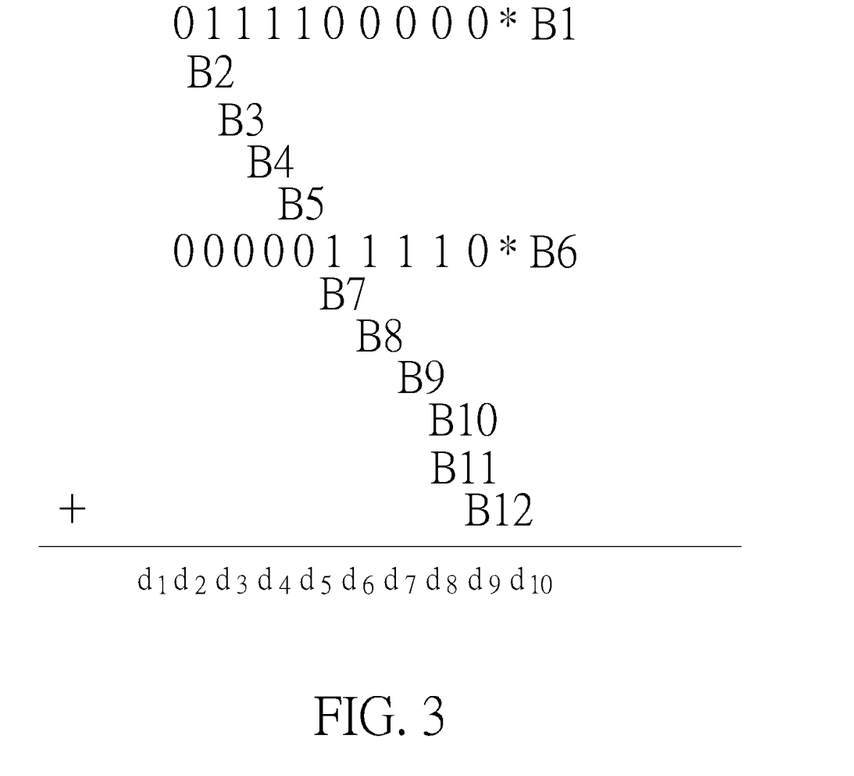
FIG. 3 is a diagram illustrating a logical method employed by a calibration logic circuit.

FIG. 3 is a diagram illustrating a logical method employed by a calibration logic circuit. According to the order of capacitor disassembling and switching, the error tolerance of the SAR ADC is as follows: at the first comparison, there is 6.66% settling error tolerance; and at the rest of comparisons, the error tolerance capability is at least one LSB, and the actual tolerance magnitude depends on whether there is a settling error or a comparison error of the comparator that is induced in the previous comparison(s).

Figure 4:
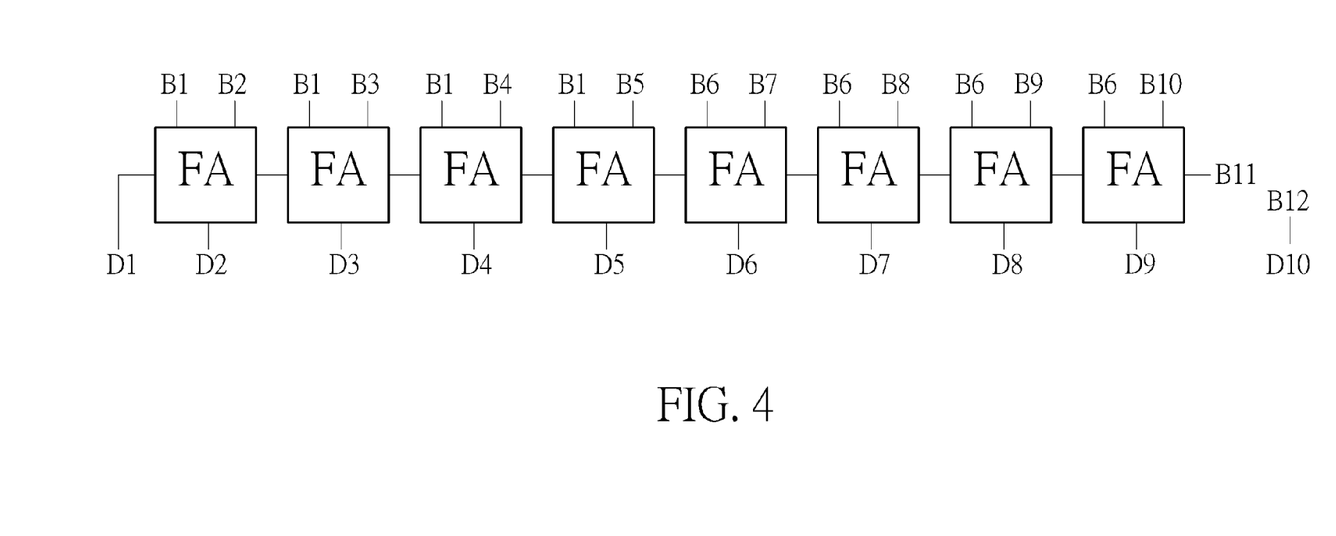
FIG. 4 is a calibration logical circuit according to an embodiment of the present invention.

FIG. 4 is a calibration logical circuit according to an embodiment of the present invention, wherein FA is representative of a full adder, B1-B12 are original output bits, and D1-D10 are calibrated output bits of a 10-bit output.

Figure 5:
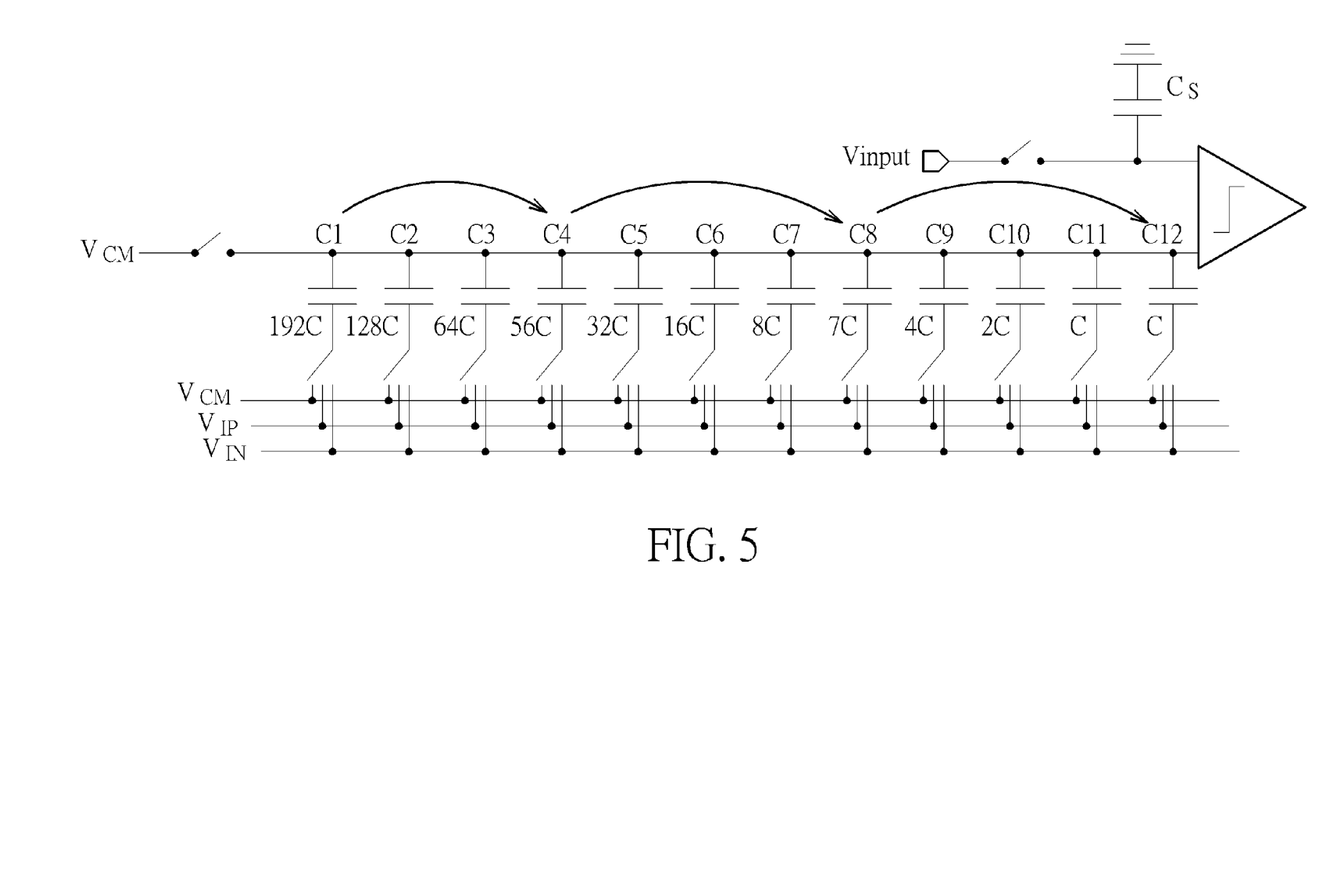
FIG. 5 is a diagram illustrating a SAR ADC according to a third embodiment of the present invention.

FIG. 5 is a diagram illustrating a SAR ADC according to a third embodiment of the present invention. The SAR ADC is a 10-bit SAR ADC with a single-ended input. In this embodiment, each of 192C, 56C, 7C, and 1C has to be a sum of non-duplicated binary numbers expect 1C. The capacitor 256C corresponding to the most significant bit (MSB) is disassembled into 192C (i.e., 128C+64C), 56C (i.e., 32C+16C+8C), 7C (i.e., 4C+2C+1C) and 1C. That is, C1 of the capacitor array [C1, C2, C3, C4, C5, C6, C7, C8, C9]=[256C, 128C, 64C, 32C, 16C, 8C, 4C, 2C, 1C] is disassemble into [192C, 56C, 7C, C]. These four disassembled sub-capacitors could be assembled in a binary sequence, i.e. in the descending capacitance order of [128C, 64C, 32C, 16C, 8C, 4C, 2C, 1C]. These four disassembled sub-capacitors could be assembled by the following binary sequence, and the final capacitor array is [C1, C2, C3, C4, C5, C6, C7, C8, C9, C10, C11, C12]=[192C, 128C, 64C, 56C, 32C, 16C, 8C, 7C, 4C, 2C, 1C, 1C].

Figure 6:
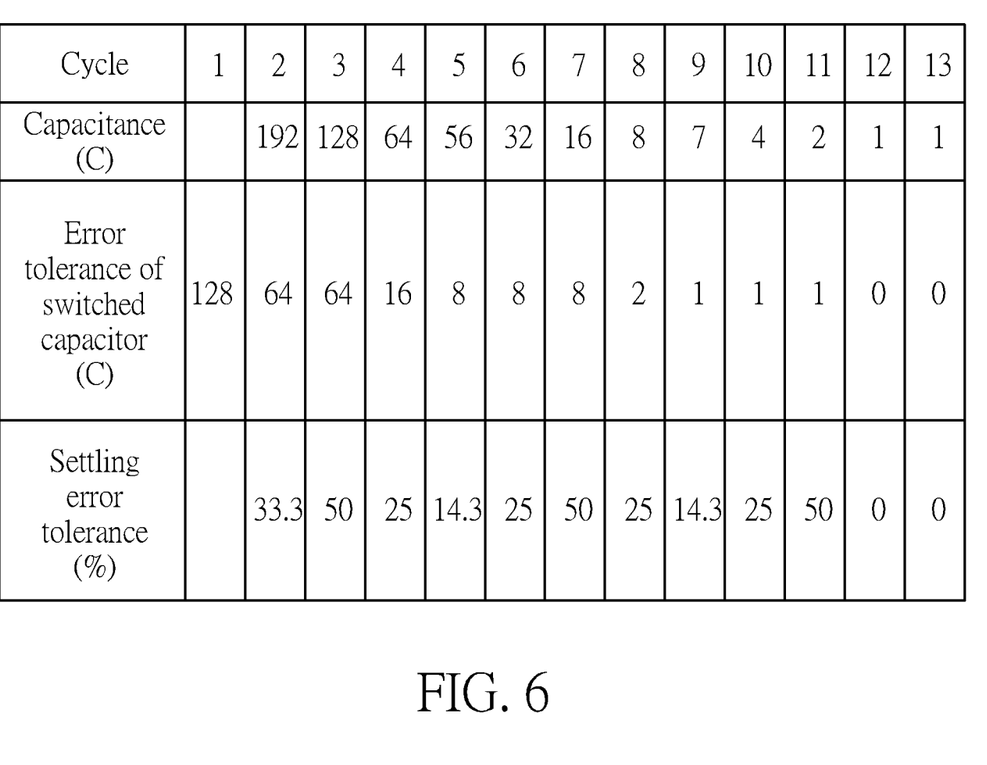
FIG. 6 is a look-up-table of estimated settling error tolerance capability.

FIG. 6 is a look-up-table of the estimated settling error tolerance capability. With regard to the third embodiment, the estimated settling error tolerance is at least 14.3% per cycle. In practice, the actual value of the settling error tolerance depends on the actual transfer process.

Figure 7:
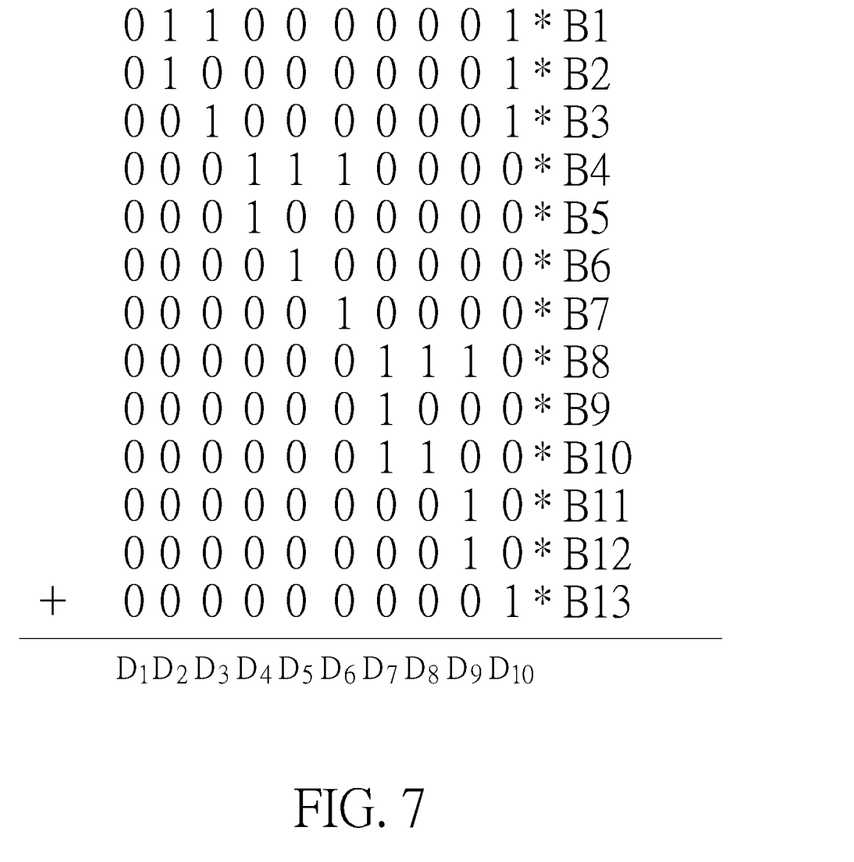
FIG. 7 is a diagram illustrating a logical method employed by a calibration logic circuit in the third embodiment of the present invention.

FIG. 7 is a diagram illustrating a logical method employed by a calibration logic circuit in the third embodiment of the present invention. The calibration method includes: multiplying each bit with a weighting factor corresponding to the switched capacitor, and then summing up the multiplication results. The weighting factor of each bit is composed of binary values, and the number of duplicated weighting factors is not more than two (except the weighting factor of the penultimate bit (i.e., LSB+1)).

Figure 8:
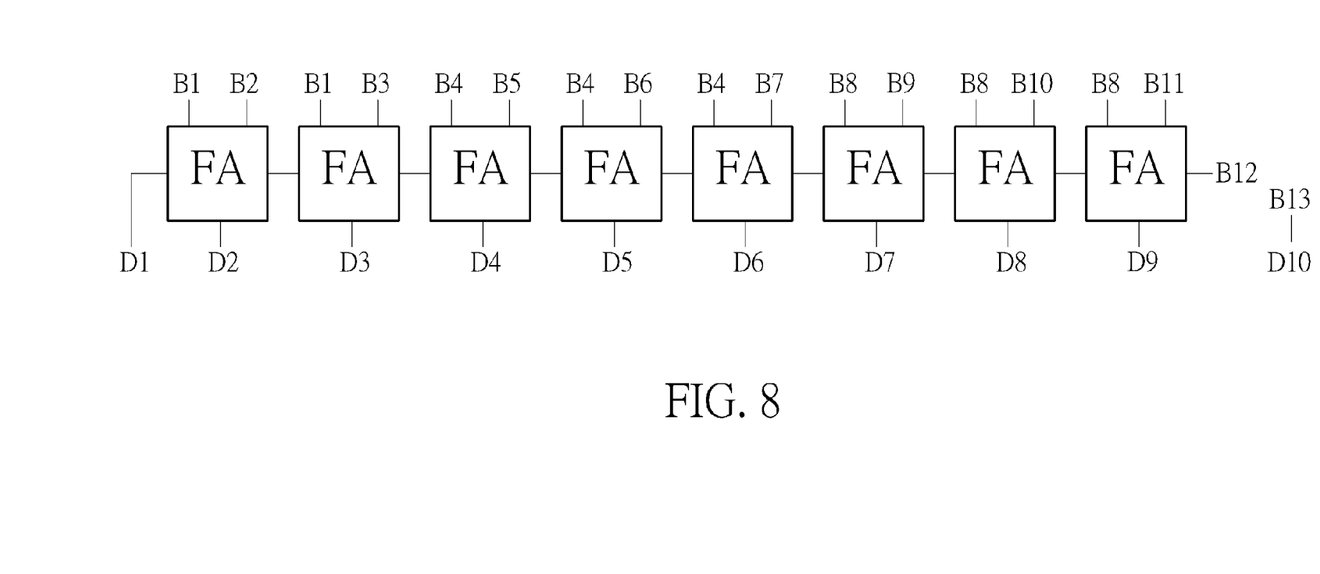
FIG. 8 is a diagram illustrating a calibration logic circuit in the third embodiment of the present invention.

FIG. 8 is a diagram illustrating a calibration logic circuit in the third embodiment of the present invention. Since the same binary weighting is not repeated more than two times, only adders are needed to realize the calibration logic circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A successive approximation analog-to-digital converter (SAR ADC), comprising:
a capacitor array, comprising M capacitors arranged to perform capacitor switching operations sequentially, wherein a sum of capacitance values of the M capacitors is equal to $(2^N-1)$ unit capacitors, M>N, and M and N are both positive integers; and a sum of capacitance values of a plurality of specific capacitors among the M capacitors is equal to $2^k$ unit capacitors, where K is a positive integer and K<N; and a comparator, arranged for comparing an output of the capacitor array and an analog input sequentially.

2. The SAR ADC of claim 1, wherein the specific capacitors are arranged in a descending capacitance order, and are arranged to perform capacitor switching operations according to the descending capacitance order.

3. The SAR ADC of claim 1, wherein the comparator generates (M+1) caparison outputs based on the analog input, and the SAR ADC further comprises:

a calibration logic circuit, coupled to the comparator, calibration logic circuit arranged for calculating a weighted sum of the (M+1) comparison outputs to generate an N-bit digital output corresponding to the analog input.

4. The SAR ADC of claim 3, wherein the calibration logic circuit sets capacitor weighting factors of first M comparison outputs of the (M+1) comparison outputs to be twice as large as unit capacitor numbers of the M capacitors, respectively, and sets a capacitor weighting factor of a last comparison output of the (M+1) comparison outputs to 1.

5. A successive approximation analog-to-digital conversion method, comprising:

controlling a capacitor array to make M capacitors perform capacitor switching operations sequentially, wherein a sum of capacitance values of the M capacitors is equal to $(2^N-1)$ unit capacitors, M>N, and M and N are both positive integers; and a sum of capacitance values of a plurality of specific capacitors among the M capacitors is equal to $2^k$ unit capacitors, where K is a positive integer and K<N; and comparing an output of the capacitor array with an analog input sequentially.

6. The method of claim 5, wherein the specific capacitors are arranged in a descending capacitance order, and are arranged to perform capacitor switching operations according to the descending capacitance order.

7. The method of claim 5, wherein the step of comparing the output of the capacitor array with the analog input sequentially comprises:

generating (M+1) caparison outputs based on the analog input; and the method further comprises:

calculating a weighted sum of the (M+1) comparison outputs to generate an N-bit digital output corresponding to the analog input.

8. The method of claim 7, wherein the step of calculating the weighted sum of the (M+1) comparison outputs comprises:

setting capacitor weighting factors of first M comparison outputs of the (M+1) comparison outputs to be twice as large as unit capacitor numbers of the M capacitors, respectively; and setting a capacitor weighting factor of a last comparison output of the (M+1) comparison outputs to 1.

* * * * *